(12) United States Patent
Kawahara et al.

(10) Patent No.: US 10,583,679 B2
(45) Date of Patent: Mar. 10, 2020

(54) PHOTOSENSITIVE RESIN PRINTING PLATE PRECURSOR AND METHOD OF MANUFACTURING PRINTING PLATE

(71) Applicant: Toray Industries, Inc., Tokyo (JP)

(72) Inventors: Hiroyuki Kawahara, Okazaki (JP); Norihito Tachi, Okazaki (JP); Kei Nagano, Okazaki (JP)

(73) Assignee: Toray Industries, Inc., Tokyo (JP)

( * ) Notice: Subject to any disclaimer, the term of this patent is extended or adjusted under 35 U.S.C. 154(b) by 58 days.

(21) Appl. No.: 15/755,937

(22) PCT Filed: Sep. 2, 2016

(86) PCT No.: PCT/JP2016/075779
§ 371 (c)(1),
(2) Date: Feb. 27, 2018

(87) PCT Pub. No.: WO2017/038970
PCT Pub. Date: Mar. 9, 2017

(65) Prior Publication Data
US 2019/0039397 A1    Feb. 7, 2019

(30) Foreign Application Priority Data

Sep. 3, 2015 (JP) ................................. 2015-173519
Mar. 28, 2016 (JP) ................................. 2016-063644

(51) Int. Cl.
*B41N 1/12* (2006.01)
*G03F 7/027* (2006.01)
(Continued)

(52) U.S. Cl.
CPC ................ *B41N 1/12* (2013.01); *B41C 1/025* (2013.01); *G03F 7/00* (2013.01); *G03F 7/027* (2013.01);
(Continued)

(58) Field of Classification Search
None
See application file for complete search history.

(56) References Cited

U.S. PATENT DOCUMENTS

2001/0044076 A1    11/2001    Hiller et al.
2015/0205201 A1*   7/2015     Abura ................ G03F 7/027
                                                              430/280.1
(Continued)

FOREIGN PATENT DOCUMENTS

JP    59-102228 A      6/1984
JP    59102228 A   *   6/1984   ........... G03F 7/0955
(Continued)

OTHER PUBLICATIONS

Extended European Search report dated Apr. 2, 2019, of counterpart European Application No. 16841999.2.

*Primary Examiner* — Joshua D Zimmerman
(74) *Attorney, Agent, or Firm* — DLA Piper LLP (US)

(57) ABSTRACT

A photosensitive resin printing plate precursor includes at least a substrate and a photosensitive resin layer, the photosensitive resin layer containing: (A) a partially saponified polyvinyl acetate, (B) a polyamide having basic nitrogen, (C) a compound having an ethylenic double bond, and (D) a photopolymerization initiator; the photosensitive resin layer including at least an underlayer and a printing surface layer; the substrate, the underlayer, and the printing surface layer being included in this order; and the photosensitive resin layer containing, as the partially saponified polyvinyl acetate (A), those (A1) having an average polymerization degree of 1,200 to 2,600 in the printing surface layer and those (A2) having an average polymerization degree of 400 to 800 in the underlayer.

9 Claims, 1 Drawing Sheet

(51) Int. Cl.
  *G03F 7/037*   (2006.01)
  *G03F 7/038*   (2006.01)
  *G03F 7/095*   (2006.01)
  *G03F 7/00*   (2006.01)
  *B41C 1/02*   (2006.01)

(52) U.S. Cl.
  CPC .............. *G03F 7/037* (2013.01); *G03F 7/038* (2013.01); *G03F 7/0388* (2013.01); *G03F 7/095* (2013.01); *G03F 7/0955* (2013.01)

(56) References Cited

U.S. PATENT DOCUMENTS

2015/0367668 A1    12/2015   Kawahara et al.
2016/0349615 A1*   12/2016   Abura ..................... G03F 7/038

FOREIGN PATENT DOCUMENTS

| | | |
|---|---|---|
| JP | 7-319151 A | 12/1995 |
| JP | 11-65115 A | 3/1999 |
| JP | 11-231546 A | 8/1999 |
| JP | 2001-272776 A | 10/2001 |
| JP | 2001-328365 A | 11/2001 |
| JP | 2001-337459 A | 12/2001 |
| JP | 2002-23349 A | 1/2002 |
| JP | 2005-326442 A | 11/2005 |
| JP | 2009-248366 A | 10/2009 |
| JP | 2014-142622 A | 8/2014 |
| JP | 2015-150798 A | 8/2015 |
| JP | 2015-158551 A | 9/2015 |
| WO | 2014/021322 A1 | 2/2014 |
| WO | 2014/129243 A1 | 8/2014 |
| WO | WO-2015122515 A1 * | 8/2015 ............. G03F 7/038 |

* cited by examiner

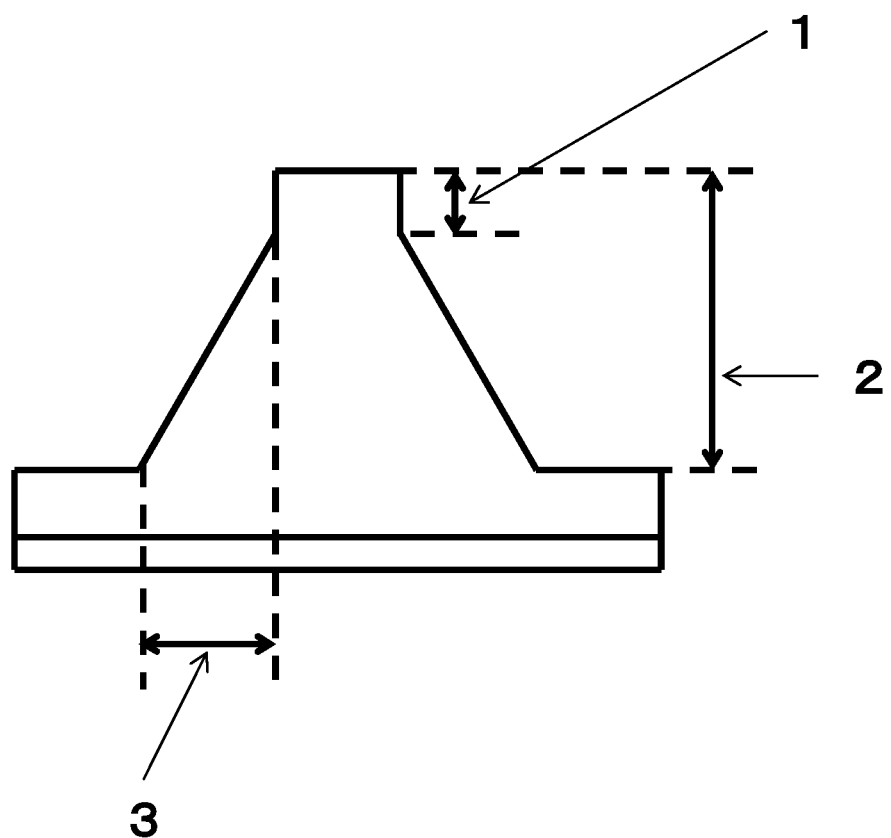

PHOTOSENSITIVE RESIN PRINTING PLATE PRECURSOR AND METHOD OF MANUFACTURING PRINTING PLATE

TECHNICAL FIELD

This disclosure relates to a photosensitive resin printing plate precursor, and particularly relates to a photosensitive resin letterpress printing plate material.

BACKGROUND

A photosensitive resin printing plate precursor including a photosensitive resin layer generally contains a soluble polymer, a photopolymerizable unsaturated bond-containing monomer, and a photopolymerization initiator as essential components in the photosensitive resin layer, and is optionally mixed with additives such as stabilizers and plasticizers.

There has been well known, as a method of forming a relief plate by forming projections and depressions on a surface of a photosensitive resin printing plate precursor, so-called "analog plate-making method" in which, using a photosensitive elastomer composition or a photosensitive resin composition, the composition is exposed to ultraviolet light through an original film to selectively cure portions of the composition which are to form an image, and uncured portions are removed with a developer (JP 11-65115 A, JP 2001-272776 A, JP 2014-142622 A).

There has been proposed, as a method of solving the problems such as manufacturing time and cost of an original film in the analog plate-making, a resin letterpress printing plate precursor comprising a photosensitive resin layer and a laser-sensitive mask layer element provided thereon, capable of forming an image mask in situ. The method of making such a resin letterpress printing plate precursor is a plate-making method in which laser radiation is performed based on image data controlled using a digital device to form an image mask in situ from a mask layer element, followed by exposure to ultraviolet light through the image mask and further development, similarly to the analog plate-making. That method is referred to as the "CTP plate-making method" in the field of resin letterpress printing plates. The CTP plate-making method reduces the above-mentioned problems of analog plate-making.

There is also known "laser engraving plate-making method" in which a relief of projections and depressions is formed by engraving with a laser (JP 2001-328365 A). That laser engraving is advantageous in that the shape of the relief can be freely controlled unlike relief formation using an original film. For example, portions to reproduce a reverse text on a material to be printed may be engraved deeply, and portions to reproduce fine half tone dots can be engraved into a shape with shoulders so that the half tone dot does not fall over under printing pressure.

High production efficiency has recently been required in a plate-making step and a printing step so that it has been required to perform time shortening of the plate-making step and to reduce time loss in the printing step, due to machine stoppage involved in crack occurrence during printing and replacement of a printing plate material, as much as possible.

There have been proposed, as the method of solving the above-mentioned problems, for example, a method of mixing a polyvinyl acetate derivative and a polyamide having basic nitrogen as disclosed in JP 11-65115 A and JP 2001-272776 A, and a method of reducing the degree of crystallinity of a partially saponified polyvinyl acetate and derivatives thereof as disclosed in JP 2014-142622 A.

The technique of JP 2014-142622 A exerted the effect of reducing crack occurred during storage of the plate material after printing, leading to time shortening of the plate-making step. However, under harsh conditions where the large number of sheets are printed with a pattern, which easily undergoes concentration of printing pressure because of particularly small relief area, without replacing a printing plate material as much as possible, crack still occurs sometimes in the relief during printing, leading to machine stoppage loss.

In view of the above-mentioned circumstances, it could be helpful to provide a photosensitive resin printing plate precursor having high water developability or rinsing properties for engraving residue, and image reproducibility, and that is also excellent in printing durability.

SUMMARY

We thus provide:
A photosensitive resin printing plate precursor comprising at least a substrate and a photosensitive resin layer, the photosensitive resin layer containing:
(A) a partially saponified polyvinyl acetate,
(B) a polyamide having basic nitrogen,
(C) a compound having an ethylenic double bond, and
(D) a photopolymerization initiator;
the photosensitive resin layer including at least an underlayer and a printing surface layer;
the substrate, the underlayer, and the printing surface layer being included in this order; and the photosensitive resin layer containing, as the partially saponified polyvinyl acetate (A), those (A1) having an average polymerization degree of 1,200 to 2,600 in the printing surface layer and those (A2) having an average polymerization degree of 400 to 800 in the underlayer.

It is thus possible to obtain a photosensitive resin printing plate precursor having high water developability or rinsing properties for engraving residue, and image reproducibility, and that is also excellent in printing durability.

BRIEF DESCRIPTION OF THE DRAWING

The FIGURE is a conceptual diagram of a cross section of a relief obtained by laser engraving.

DESCRIPTION OF REFERENCE NUMERALS

1 Top
2 Bottom
3 Width

DETAILED DESCRIPTION

Examples of our precursors and methods will be described below.

As a partially saponified polyvinyl acetate (A) contained in a photosensitive resin printing plate precursor (hereinafter sometimes abbreviated to the compound (A)), a partially saponified polyvinyl acetate or derivatives thereof is/are used. As used herein, the partially saponified polyvinyl acetate derivative means a partially saponified polyvinyl acetate in which crosslinkable groups are introduced into a side chain, and a modified partially saponified polyvinyl acetate in which reactive groups such as carboxyl groups are introduced starting from a hydroxyl group of a side chain of the partially saponified polyvinyl acetate. The crosslinkable group means a reactive group capable of cross-linking by a radical reaction. The crosslinkable group is preferably a group having a non-aromatic unsaturated carbon-carbon bond, and particularly preferably a group having an ethylenic double bond. Specific examples thereof include a vinyl group or a (meth)acryloyl group. The (meth)acryloyl group means an acryloyl group or a methacryloyl group.

Specifically, the method of introducing crosslinkable groups into a partially saponified polyvinyl acetate is, for example, a method in which a partially saponified polyvinyl acetate is reacted with an acid anhydride and reactive groups such as carboxyl groups are introduced into a polymer side chain starting from a hydroxyl group of the partially saponified polyvinyl acetate, and then crosslinkable groups are introduced by reacting the reactive groups with an unsaturated epoxy compound. There is also exemplified a method in which vinyl acetate is copolymerized with a monomer selected from an unsaturated carboxylic acid, an unsaturated carboxylic acid salt, and an unsaturated carboxylic ester and the polymer thus obtained is partially saponified, and then crosslinkable groups are introduced by reacting a carboxyl group possessed by this polymer with an unsaturated epoxy compound.

If crosslinkable groups are introduced into the partially saponified polyvinyl acetate, a monomer, which is a photo-cross-linking agent in a printing plate precursor is also cross-linked with the crosslinkable group of the partially saponified polyvinyl acetate, to obtain a cross-linked printing plate precursor having high molecular weight in the step of applying activating light to the photosensitive resin printing plate precursor to obtain a cross-linked printing plate precursor, and thus it is possible to improve the toughness of a printing plate, and washability in the development step or the rinsing step.

The crosslinkable group in the partially saponified polyvinyl acetate derivative of the compound (A) exists in an amount of preferably 0.08 mol/kg or more, and more preferably 0.12 mol/kg or more to enhance the effect of improving relief defects in the development step or the rinsing step. Meanwhile, the content of the crosslinkable group is preferably 0.72 mol/kg or less, and more preferably 0.36 mol/kg or less to maintain the water developability and water solubility of the photosensitive resin printing plate precursor.

As used herein, the content of the crosslinkable group means the number of mols of the crosslinkable group derived from a partially saponified polyvinyl acetate derivative included in 1 kg of a photosensitive resin composition. The photosensitive resin composition means a composition containing (A) a partially saponified polyvinyl acetate, (B) a polyamide having basic nitrogen, (C) a compound having an ethylenic double bond, and (D) a photopolymerization initiator.

The compound (A) includes at least structural units (I) and (II). When the compound (A) is a partially saponified polyvinyl acetate derivative, the compound further includes at least structural unit (III).

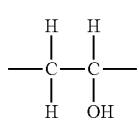

(I)

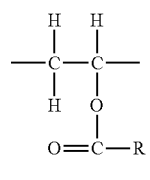

(II)

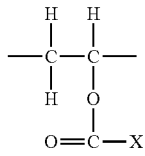

(III)

In the formulas, R is a hydrocarbon group having 1 to 20 carbon atoms, and X is a functional group having an unsaturated carbon-carbon bond at the end. R is preferably a methyl group, an ethyl group, a propyl group, or a butyl group, and more preferably a methyl group. X is preferably an organic group including a vinyl group, an ethenyl group, a propenyl group or the like. Specific examples thereof include, but are not limited to, those in which an epoxy compound having a vinyl group, an ethenyl group, or a propenyl group is further bonded to the residue of a dicarboxylic anhydride such as succinic anhydride, as mentioned later.

When the photosensitive resin printing plate precursor is manufactured by an analog plate-making method or a CTP plate-making method, there is a need to include a development step of removing uncured portions, to which activating light is not applied, with water or a brush. Therefore, the photosensitive resin printing plate precursor is required to have high developability. When the photosensitive resin printing plate precursor is manufactured by a laser engraving plate-making method, almost all laser-radiated resin is decomposed and vaporized, but the resin sometimes partially adheres onto a plate surface and remains as a solid body. This is referred to as the engraving residue. The step of washing the engraving residue with water or a brush is referred to as the rinsing step, and the photosensitive resin printing plate precursor is required to have high rinsing properties for engraving residue.

The amount of the structural unit (I) in the partially saponified polyvinyl acetate (A) is preferably 60 mol % or more, and more preferably 70 mol % or more, since it is possible to obtain high water solubility and sufficient developability or rinsing properties for engraving residue. To maintain the water solubility during preparation of a photosensitive resin composition, the amount of the structural unit (I) is preferably 99 mol % or less, and more preferably 95 mol % or less. When the compound (A) is a partially saponified polyvinyl acetate derivative, the amount of the structural unit (III) is preferably 1 mol % or more, and more preferably 2 mol % or more, since it is possible to obtain the reactivity with a compound (C) having an ethylenic double bond (hereinafter sometimes abbreviated to the compound (C)). The amount of the structural unit (III) is preferably 40 mol % or less, and more preferably 30 mol % or less, since it is possible to obtain high water developability or rinsing properties for engraving residue.

As an alternative method of introducing crosslinkable groups into a partially saponified polyvinyl acetate, there also exists a method of reacting a partially saponified polyvinyl acetate with an acrylic compound having an N-methylol group. Herein, the N-methylol group corresponds to the crosslinkable group.

The content of the acrylic compound having an N-methylol group is preferably 2 parts by mass or more, and more preferably 5 parts by mass or more, based on 100 parts by mass of the partially saponified polyvinyl acetate, since the effect of reducing relief defects in the development step or the rinsing step for engraving residue is exerted by obtaining a sufficient reaction of the crosslinkable group. The content of the acrylic compound having an N-methylol group is preferably 40 parts by mass or less, and more preferably 30 parts by mass or less, since high developability or rinsing properties for engraving residue is/are obtained.

Examples of the acrylic compound having an N-methylol group include N-methylolacrylamide, N-methylolmethacrylamide, N-methyl-N-methylolacrylamide, N-methyl-N-methylolmethacrylamide, N-ethyl-N-methylolacrylamide, N-ethyl-N-methylolmethacrylamide and the like. Particularly, N-methylolacrylamide or N-methylolmethacrylamide is preferable. These acrylic compounds may be used alone or in combination of two or more.

In the photosensitive resin printing plate precursor, a photosensitive resin layer is of a two-layered structure consisting of an underlayer and a printing surface layer. Namely, the photosensitive resin printing plate precursor includes a substrate, an underlayer, and a printing surface layer in this order. The printing surface layer is in direct contact with the body to be printed and therefore affects the printing durability. The underlayer is not in direct contact with the body to be printed.

The photosensitive resin printing plate precursor contains, as the partially saponified polyvinyl acetate (A), those (A1) having an average polymerization degree of 1,200 to 2,600 (hereinafter sometimes abbreviated to the compound (A1)) in the printing surface layer and those (A2) having an average polymerization degree of 400 to 800 (hereinafter sometimes abbreviated to the compound (A2)) in the underlayer.

Main causative of crack occurred during printing is crack occurrence due to stress during printing. Especially, an ink or a solvent to be used in printing permeates into the outermost surface of a printing plate, thus tending to cause chemical stress crack in which crack starts from the outermost surface. This chemical stress crack is likely to occur in a rotary printing press for label printing or an intermittent rotary printing press, which tends to apply strong printing pressure. Plate surface hardness of a printing plate to be used in these printing presses is preferably 30 to 70°, more preferably 40 to 60°, and still more preferably about 55°, in terms of a type D durometer hardness. Meanwhile, even when using a printing plate with the same plate surface hardness, a problem is less likely to occur by a printing method which applies low printing pressure, like dry offset printing.

In a conventional photosensitive resin printing plate precursor, because of high degree of crystallinity of a partially saponified polyvinyl acetate, there was a tendency that a printing plate having hard and brittle properties is obtained. Our photosensitive resin printing plate precursor is characterized in that a layer made of a photosensitive resin composition has a two-layered structure consisting of an underlayer and a printing surface layer and the printing surface layer contains a partially saponified polyvinyl acetate (A) having higher average polymerization degree than that of the partially saponified polyvinyl acetate used in the conventional technique, whereby, the printing surface layer exhibits low degree of crystallinity and high toughness, and an ink or a solvent is less likely to permeate and the influence is hardly exerted even when the ink or solvent permeates. Thus, chemical stress crack can be reduced. Use of the compound (A2) having higher water solubility than that of the compound (A1) and having high developability or rinsing properties for engraving residue in the underlayer enables enhancement of the developability of the entire printing plate precursor or rinsing properties for engraving residue. Inclusion of the compound (A2) in the underlayer enables achievement of the plate surface hardness suited for printing using a rotary printing press for label printing or an intermittent rotary printing press. Namely, in our photosensitive resin printing plate precursor, a printing surface layer having high printing durability is disposed on the outermost surface of a printing plate, from which cracks start to adjust physical properties such as plate surface hardness required as the printing plate, and an underlayer is selectively disposed to improve the developability and rinsing properties for engraving residue. Thus, printing durability is improved while maintaining high developability and rinsing properties for engraving residue as well as image reproducibility, leading to achievement of both improvement of the print quality and improvement of the printing durability.

Mention will now be made of the compounds (A1) and (A2). The same apply to when the compound (A) is a partially saponified polyvinyl acetate or derivatives thereof.

To impart high printing durability, the printing surface layer contains the compound (A1) having an average polymerization degree of 1,200 to 2,600. The average polymerization degree is preferably 1,200 or more, and more preferably 1,400 or more, since it is possible to obtain sufficient printing durability. The average polymerization degree is preferably 2,600 or less, and more preferably 2,300 or less, since it is possible to obtain satisfactory adhesion between the printing surface layer and the underlayer.

The content of the compound (A1) is preferably 15% by mass to 70% by mass based on 100% by mass of the entire printing surface layer. The content of 15% by mass or more enables achievement of high printing durability, while the content of 70% by mass or less enables achievement of the solubility required to the photosensitive resin composition.

The underlayer contains the compound (A2) having an average polymerization degree of 400 to 800. The average polymerization degree is preferably 400 or more since sufficient relief water resistance can be obtained, thus reducing relief defects in the development step or the rinsing step for engraving residue. The average polymerization degree is preferably 800 or less, and more preferably 600 or less, since it is possible to obtain the plate surface hardness suited for printing using a rotary printing press for label printing or an intermittent rotary printing press.

The content of the compound (A2) is preferably 30% by mass to 70% by mass based on 100% by mass of the entire underlayer. The content of 30% by mass or more enables achievement of sufficient photopolymerization rate, while the content of 70% by mass or less enables achievement of the plate surface hardness suited for printing using a rotary printing press for label printing or an intermittent rotary printing press.

The printing surface layer can further contain, as the partially saponified polyvinyl acetate (A), a polymer (A1-1) having an average polymerization degree of 400 to 1,000 (hereinafter sometimes abbreviated to the compound (A1-1)), thus making it possible to enhance the solubility required to the photosensitive resin composition. In this case, a molar ratio (A1)/(A1-1) is preferably 30/70 to 100/0. When the molar ratio is in the above range, high printing durability can be obtained.

The average polymerization degree of the compound (A1-1) is preferably 400 or more since sufficient relief water resistance can be obtained, thus enabling reduction of relief defects in the water development step or the rinsing step for engraving residue, and preferably 1,000 or less since it is possible to obtain high solubility of the photosensitive resin composition.

The content of the compound (A1-1) is preferably 5 to 40% by mass based on 100% by mass of the entire underlayer. The content of 5% by mass or more enables enhancement of the solubility required to the photosensitive resin composition, while the content of 40% by mass or less enables achievement of sufficient printing durability.

The average polymerization degree of the compound (A) can be obtained in accordance with the method for the measurement of average polymerization degree mentioned in "3. Testing methods" of JIS K 6726:1994 "Testing methods for polyvinyl alcohol".

It is possible to obtain the average polymerization degree of the compound (A) in the photosensitive resin composition by measuring the mass average molecular weight using high performance liquid chromatography. A pump DP8020 (manufactured by TOSOH CORPORATION) and a detector RI-71 (manufactured by SHOWA DENKO K.K.) were used, and three columns TSKgelGMPWXL (manufactured by TOSOH CORPORATION) were used in series. A mixed solvent of an aqueous sodium nitrate solution and acetonitrile was used as a developing solvent, and polyethylene oxide and polyethylene glycol were used as standard samples.

A polyamide having basic nitrogen (B) (hereinafter sometimes abbreviated to the compound (B)) is water soluble and can solve problems such as relief defects during the water development step or the rinsing step for engraving residue, or relief defects during printing often caused by mixing the compound (A) having high degree of crystallinity. Mixing of the compound (B) enables reduction of the degree of crystallinity of the compound (A), leading to enhancement of the physical resistance of the photosensitive resin printing plate precursor. The polyamide having basic nitrogen is a polymer containing basic nitrogen at some part of the main chain or side chain. Basic nitrogen is a nitrogen atom constituting an amino group which is not an amide group. Examples of such polyamide include polyamides having a tertiary amino group in the main chain. The polyamide having basic nitrogen can be obtained by performing a reaction such as condensation polymerization or polyaddition using a monomer having basic nitrogen alone or using any other monomer. The monomer having basic nitrogen is preferably a monomer having a piperazine group or an N,N-dialkylamino group, and more preferably a monomer having a piperazine group.

Preferred examples of the monomer having basic nitrogen include diamines such as N,N'-bis(aminomethyl)-piperazine, N,N'-bis(β-aminoethyl)-piperazine, N,N'-bis(γ-aminobenzyl)-piperazine, N-(β-aminoethyl)piperazine, N-(β-aminopropyl)piperazine, N-(ω-aminohexyl)piperazine, N-(β-aminoethyl)-2,5-dimethylpiperazine, N,N-bis(β-aminoethyl)-benzylamine, N,N-bis(γ-aminopropyl)-amine, N,N'-dimethyl-N,N'-bis(γ-aminopropyl)-ethylenediamine, and N,N'-dimethyl-N,N'-bis(γ-aminopropyl)-tetramethylenediamine; dicarboxylic acids such as N,N'-bis(carboxymethyl)-piperazine, N,N'-bis(carboxymethyl)-methylpiperazine, N,N'-bis(carboxymethyl)-2,6-dimethylpiperazine, N,N'-bis(β-carboxyethyl)-piperazine, N,N-bis(carboxymethyl)-methylamine, N,N-bis(β-carboxyethyl)-ethyl amine, N,N-bis(β-carboxyethyl)-methylamine, N,N-di(β-carboxyethyl)-isopropylamine, N,N'-dimethyl-N,N'-bis-(carboxyethyl)-ethylenediamine, and N,N'-dimethyl-N,N'-bis-(β-carboxyethyl)-ethylenediamine, and lower alkyl esters; acid halides, ω-amino acids such as N-(aminomethyl)-N'-(carboxymethyl)-piperazine, N-(aminomethyl)-N'-(β-carboxyethyl)-piperazine, N-(β-aminoethyl)-N'-(β-carboxyethyl)-piperazine, N-carboxymethylpiperazine, N-(β-carboxyethyl)piperazine, N-(γ-carboxyhexyl)piperazine, N-(ω-carboxyhexyl)piperazine, N-(aminomethyl)-N-(carboxymethyl)-methylamine, N-(β-aminoethyl)-N-(β-carboxyethyl)-methylamine, N-(aminomethyl)-N-(β-carboxyethyl)-isopropylamine, and N,N'-dimethyl-N-(aminomethyl)-N'-(carboxymethyl)-ethylenediamine. These monomers may be used in combination with any other diamine, dicarboxylic acid, ω-amino acid, or lactam, and polymerized, thus making it possible to obtain a polyamide (B) containing basic nitrogen.

The amount of such monomer component containing basic nitrogen is preferably 10 to 100 mol %, and more preferably 10 to 80 mol %, based on the amount of all components of the polyamide, i.e., the amino carboxylic acid unit (including when a lactam is used as a raw material), the dicarboxylic acid unit, and the diamine structural unit. If the content is 10 mol % or more, water solubility is high and compatibility with the compound (A) is satisfactory. If the content is 80 mol % or less, it is possible to maintain thickness accuracy of the printing plate at a high level without excessively absorbing water during storage of the printing plate.

The content of the compound (B) is preferably 1 to 40 parts by mass based on 100 parts by mass of the compound (A) in each of the printing surface layer and the underlayer. If the content is 1 part by mass or more, it is possible to inhibit relief defects in the water development step or the rinsing step for engraving residue, or relief defects during printing. If the content is 40 parts by mass or less, it is possible to maintain the plate surface hardness suited for the printing plate.

Specific examples of the compound (C) having an ethylenic double bond (hereinafter sometimes abbreviated to the compound (C)) include, but are not limited to: (meth) acrylates having a hydroxyl group such as 2-hydroxyethyl (meth)acrylate, 2-hydroxypropyl (meth)acrylate, 2-hydroxybutyl (meth)acrylate, 3-chloro-2-hydroxypropyl (meth)acrylate, and β-hydroxy-β'-(meth)acryloyloxyethyl phthalate; alkyl (meth)acrylates such as methyl (meth)acrylate, ethyl (meth)acrylate, propyl (meth)acrylate, butyl (meth)acrylate, isoamyl (meth)acrylate, 2-ethylhexyl (meth)acrylate, lauryl (meth)acrylate, and stearyl (meth)acrylate; cycloalkyl (meth)acrylates such as cyclohexyl (meth)acrylate; halogenated alkyl (meth)acrylates such as chloroethyl (meth)acrylate and chloropropyl (meth)acrylate; alkoxyalkyl (meth)acrylates such as methoxyethyl (meth)acrylate, ethoxyethyl (meth)acrylate, and butoxyethyl (meth)acrylate; phenoxyalkyl (meth)acrylates such as phenoxyethyl acrylate and nonylphenoxyethyl (meth)acrylate; alkoxyalkylene glycol (meth)acrylates such as ethoxydiethylene glycol (meth) acrylate, methoxytriethylene glycol (meth)acrylate, and methoxydipropylene glycol (meth)acrylate; (meth)acrylamides such as (meth)acrylamide, diacetone(meth)acrylamide, and N,N'-methylenebis(meth)acrylamide; compounds having only one ethylenic double bond such as 2,2-dimethylaminoethyl (meth)acrylate, 2,2-diethyl aminoethyl (meth) acrylate, N,N-dimethyl aminoethyl (meth)acryl amide, N,N- dimethylaminopropyl(meth)acrylamide, 2-hydroxyethyl (meth)acrylate, and 3-chloro-2-hydroxypropyl (meth)acrylate; di(meth)acrylates of polyethylene glycol such as diethylene glycol di(meth)acrylate; di(meth)acrylates of polypropylene glycol such as dipropylene glycol di(meth)acrylate; trimethylolpropane tri(meth)acrylate, pentaerythritol tri(meth)acrylate, pentaerythritol tetra(meth)acrylate, glycerol tri(meth)acrylate; polyvalent (meth)acrylates obtained by an addition reaction of ethylene glycol diglycidyl ether with a compound having an ethylenic double bond and active hydrogen such as an unsaturated carboxylic acid or an unsaturated alcohol; polyvalent (meth)acrylates obtained by an addition reaction of an unsaturated epoxy compound such as glycidyl (meth)acrylate with a compound having active hydrogen such as carboxylic acid or amine; compounds having a 5- to 7-membered ring and an ethylenic double bond such as benzyl (meth)acrylate, cyclohexyl (meth)acrylate, tetrahydrofurfuryl (meth)acrylate, phenoxymethyl (meth)acrylate, 2-(meth)acryloyloxyethylhexahydrophthalic acid, phenoxydiethylene glycol (meth)acrylate, 2-hydroxy-3-phenoxypropyl (meth)acrylate, 2-(meth)acryloyloxyethylphthalic acid, neopentyl glycol-(meth)acrylic acid-benzoic acid ester, (meth)acryloylmorpholine, styrene and derivatives thereof, vinylpyridine, N-vinyl-2-pyrrolidone, β-(meth)acryloyloxyethyl hydrogen phthalate, N-phenylmaleimide and derivatives thereof, N-(meth)acryloxysuccinimide, (meth)acrylic acid-2-naphthyl, N-phenyl(meth)acrylamide, divinylethyleneurea, divinylpropyleneurea, vinylcaprolactam, vinylcarbazole, bicyclopentenyl (meth)acrylate, 1-vinylimidazole, 2-methyl-1-vinylimidazole, (2-methyl-ethyldioxolan-4-yl)methylacrylate, imide acrylate, [4-(hydroxymethyl)cyclohexyl]methyl (meth)acrylate, (2-oxy-1,3-dioxolan-4-yl)methyl (meth)acrylate, 2-(oxydiimidazolidin-1-yl)ethyl (meth)acrylate, and 2,2,6,6-tetramethyl-4-piperidyl acrylate; and compounds having two or more ethylenic double bonds, for example, polyvalent (meth)acrylamides such as methylenebis(meth)acrylamide and polyvalent vinyl compounds such as divinylbenzene.

The content of such compound (C) is preferably 5 to 200 parts by mass based on 100 parts by mass of the compound (A) in each of the printing surface layer and the underlayer. The content is preferably 5 parts by mass or more since it is possible to obtain the plate surface hardness suited for printing using a rotary printing press for label printing or an intermittent rotary printing press, and preferably 200 parts by mass or less since a photosensitive resin composition can be easily formed.

When the compound (C) is a compound having a 5- to 7-membered ring and an ethylenic double bond, the 5- to 7-membered ring is a bulky substituent so that barrier to molecular motion becomes high. Therefore, when mixed in a photosensitive resin composition, the molecular motion of adjacent compounds of the compound having a 5- to 7-membered ring and an ethylenic double bond is also restricted. Therefore, it is expected to inhibit crystallization of the compound (A), leading to an improvement in the resistance to repeated impacts during printing. When a compound having a 5- to 7-membered ring and an ethylenic double bond in the molecule has a heterocyclic ring or one or more functional groups selected from a hydroxyl group, a carboxyl group, and an amino group, an interaction with a hydroxyl group of the compound (A) occurs through hydrogen bonding, thus enhancing the inhibitory effect on crystallization of the compound (A) and improving the compatibility with the compound (A).

The number average molecular weight of the compound having a 5- to 7-membered ring and an ethylenic double bond is preferably 300 or less, and more preferably 100 or more and 300 or less. The molecular weight is preferably 100 or more since sufficient photopolymerization rate can be obtained. The molecular weight is preferably 300 or less since high compatibility with the compound (A) can be obtained.

To adjust the image reproducibility, the printing surface layer and the underlayer may contain a compound having an ethylenic double bond other than the compound (C).

The photosensitive resin printing plate precursor contains (D) a photopolymerization initiator (hereinafter sometimes abbreviated to the component (D)). Any photopolymerization initiator can be used as long as it can polymerize polymerizable carbon-carbon unsaturated groups when subjected to light. Particularly, preferred are those that can generate radicals by self-decomposition or hydrogen abstraction upon light absorption. Examples thereof include benzoin alkyl ethers, benzophenones, anthraquinones, benzyls, acetophenones, diacetyls and the like.

The amount of the photopolymerization initiator is preferably 0.1 to 20 parts by mass based on 100 parts by mass of the compound (A) in each of the printing surface layer and the underlayer.

It is also possible to add polyhydric alcohols as a compatibilizing agent for enhancing the compatibility and flexibility to the photosensitive resin composition. Examples of such polyhydric alcohols include ethylene glycol, diethylene glycol, triethylene glycol, glycerin and derivatives thereof, trimethylolpropane and derivatives thereof, trimethylolethane and derivatives thereof, pentaerythritol and derivatives thereof and the like.

The content of such polyhydric alcohols is preferably 30% by mass or less based on the entire photosensitive resin composition. The addition of polyhydric alcohols leads to an improvement in compatibility, thus enabling inhibition of turbidity of a resin composition and bleed out of a low molecular weight component.

To enhance the thermal stability of the photosensitive resin composition, a polymerization inhibitor can be added. Preferred examples of the polymerization inhibitor include phenols, hydroquinones, catechols, hydroxyamine derivatives and the like.

The content of the polymerization inhibitor is preferably 0.001 to 5% by mass based on the entire photosensitive resin composition.

It is also possible to add, as other additives, dyes, pigments, surfactants, antifoaming agents, ultraviolet light absorbers, flavoring agents and the like to the photosensitive resin composition.

The photosensitive resin printing plate precursor will be described below. The photosensitive resin printing plate precursor includes at least a substrate (E), and a photosensitive resin layer (F) formed from the photosensitive resin composition.

It is possible to use, as substrate (E), plastic sheets of a polyester, synthetic rubber sheets of a styrene-butadiene rubber, metal plates of steel, stainless steel, and aluminum and the like.

The thickness of the substrate is not particularly limited and is preferably 100 to 350 μm from the viewpoint of handleability and flexibility. The thickness of 100 μm or more improves the handleability of the substrate, and the thickness of 350 μm or less improves the flexibility of the printing plate precursor.

The substrate (E) is preferably subjected to adhesion-improving treatment to improve the adhesion to the photosensitive resin layer (F). Examples of the method of adhesion-improving treatment include mechanical treatments such as sandblasting, physical treatments such as corona discharge, and chemical treatments such as coating. It is preferred to form an adhesion-improving layer (G) by coating from the viewpoint of the adhesion.

The photosensitive resin layer (F) is formed from the photosensitive resin composition. The thickness of the photosensitive resin layer (F) is preferably 0.3 mm or more, and more preferably 0.5 mm or more, from the viewpoint of having sufficient relief depth and improving the printability. Meanwhile, from the viewpoint of allowing activating light used for exposure to sufficiently arrive at the bottom portion to further improve the image reproducibility, the thickness is preferably 5 mm or less, and more preferably 3 mm or less.

The photosensitive resin layer (F) is composed of at least two layers consisting of an underlayer (F1) formed on the substrate (E) and a printing surface layer (F2) formed thereon. Namely, the photosensitive printing plate precursor includes at least the substrate (E), the underlayer (F1), and the printing surface layer (F2) in this order. The thickness of the underlayer (F1) is preferably 0.01 mm or more and 4.99 mm or less, and more preferably 0.05 mm or more and 4.95 mm or less. The thickness of the printing surface layer (F2) is preferably 0.01 mm or more and 4.99 mm or less, and more preferably 0.05 mm or more and 4.95 mm or less.

The printing plate precursor preferably has a cover film (H) on the photosensitive resin layer (F) from the viewpoint of surface protection and prevention of attachment of foreign matter. The photosensitive resin layer (F) may be in direct contact with the cover film (H), or there may be one or more layers between the photosensitive resin layer (F) and the cover film (H). Examples of the layer between the photosensitive resin layer (F) and the cover film (H) include an anti-adhesion layer provided to prevent the adhesion of the photosensitive resin layer surface.

The material of the cover film (H) is not particularly limited, and plastic sheets of polyester and polyethylene are preferably used. The thickness of the cover film (H) is not particularly limited, and is preferably 10 to 150 µm from the viewpoint of the handleability and cost. The cover film surface may be roughened to improve the adhesion of an original film.

In the CTP plate-making method, the photosensitive printing plate precursor may further include a heat-sensitive mask layer (I). The heat-sensitive mask layer (I) is preferably a layer which substantially shields ultraviolet light and absorbs infrared laser light during drawing, and partially or entirely undergoes sublimation or melt-removal, instantaneously, by heat generated. A difference in optical density between the laser-radiated area and the laser-unradiated area occurs, and thus makes it possible to exert the same function as that of a conventional original film.

As used herein, having the function of shielding ultraviolet light means that the optical density of the heat-sensitive mask layer (I) is 2.5 or more, and more preferably 3.0 or more. The optical density is generally represented by D and is defined by the following equation: $D=\log_{10}(100/T)=\log_{10}(I_0/I)$ (where T is a transmittance (%), $I_0$ is an incident light intensity during the measurement of the transmittance, and I is a transmitted light intensity).

There have been known, as the method of measuring the optical density, a method of calculating from a measured value of a transmitted light intensity at a given incident light intensity, and a method of calculating from a measured value of an incident light intensity required to reach a certain transmitted light intensity. The optical density refers to the value calculated from the transmitted light intensity of the former.

The optical density can be measured by Macbeth densitometer "TR-927" (manufactured by Kollorgen Instruments Corp.) using an orthochromatic filter.

Preferred specific examples of the material of the heat-sensitive mask layer (I) include a resin containing an infrared absorbing substance dispersed therein. The infrared absorbing substance is not particularly limited as long as it is a substance which can absorb infrared light to convert into heat. Examples thereof include black pigments such as carbon black, aniline black, and cyanine black; phthalocyanine- and naphthalocyanine-based green pigments; rhodamine pigments, naphthoquinone-based pigments, polymethine-based dyes, diimonium salts, azoimonium-based pigments, chalcogen-based pigments, carbon graphite, iron powders, diamine-based metal complexes, dithiol-based metal complexes, phenolthiol-based metal complexes, mercaptophenol-based metal complexes, aryl aluminum metal salts, crystallization water-containing inorganic compounds, copper sulfate, chromium sulfide, silicate compounds; metal oxides such as titanium oxide, vanadium oxide, manganese oxide, iron oxide, cobalt oxide, and tungsten oxide; hydroxides and sulfates of these metals; and metal powders of bismuth, tin, tellurium, iron, aluminum and the like.

Among these, carbon black is particularly preferable from the viewpoint of the photothermal conversion rate, economic efficiency and handleability as well as the below-mentioned ultraviolet-absorbing function. A resin component to be used as a binder is not particularly limited, and a thermosetting resin can be preferably used from the viewpoint of the stability and the scratch resistance of the heat-sensitive mask layer (I).

The photosensitive printing plate precursor may also include an adhesive strength-adjusting layer (J) between the photosensitive resin layer (F) and the heat-sensitive mask layer (I). It is preferred that the adhesive strength-adjusting layer (J) contains a water-soluble and/or water-dispersible resin such as a partially saponified polyvinyl acetate having a saponification degree of 30 mol % or more, or a polyamide. The adhesive strength-adjusting layer (J) may also contain resins or monomers for optimization of the adhesive strength and/or additives such as surfactants or plasticizers for ensuring the coatability or stability.

The thickness of the adhesive strength-adjusting layer (J) is preferably 15 µm or less, and more preferably 0.1 µm or more and 5 µm or less. If the thickness is 15 µm or less, refraction and scattering of light caused by the layer when exposed to ultraviolet light are inhibited, thus a sharper relief image can be obtained. The adhesive strength-adjusting layer (J) can be easily formed when the thickness is 0.1 µm or more.

The photosensitive printing plate precursor may further include a peel assist layer (K) on the heat-sensitive mask layer (I). The peel assist layer (K) is preferably provided between the heat-sensitive mask layer (I) and the cover film (H). It is preferred that the peel assist layer (K) has a function of easily peeling off only the peel assist layer (K), only the cover film (H), or both the cover film (H) and the peel assist layer (K) from the photosensitive printing plate precursor. When the cover film (H) and the heat-sensitive mask layer (I) are laminated adjacently to each other and the adhesion strength between the two layers is strong, the cover film (H) cannot be peeled off or, when it is peeled off, the heat-sensitive mask layer (I) may be partially left adhered to the side of the cover film (H) to cause a void on the heat-sensitive mask layer (I). Therefore, it is preferred that the peel assist layer (K) be constituted by a substance which strongly adheres to the heat-sensitive mask layer (I) but weakly adheres to the cover film (H) such that it can be peeled off, or by a substance which weakly adheres to the heat-sensitive mask layer (I) such that it can be peeled off but strongly adheres to the cover film (H). In some cases, after the cover film (H) is peeled off, the peel assist layer (K) remains on the side of the heat-sensitive mask layer (I) and serves as the outermost layer. It is preferred that the peel assist layer be not adhesive from the viewpoint of the handleability and be substantially transparent for performing exposure with ultraviolet light through the peel assist layer (K).

Examples of the material of the peel assist layer (K) include polyvinyl alcohol, polyvinyl acetate, partially saponified polyvinyl alcohol, hydroxyalkyl cellulose, alkyl cellulose, polyamide resin and the like. It is preferred that the peel assist layer contains, as a main component, a resin which is soluble or dispersible in water and weakly adhesive. Among these, from the viewpoint of the adhesiveness, a partially saponified polyvinyl alcohol having a saponification degree of 60 to 99 mol % as well as hydroxyalkyl cellulose and alkyl cellulose whose alkyl group has 1 to 5 carbon atoms can be particularly preferably used.

The peel assist layer (K) may further contain an infrared-absorbing substance to be easily melted and removed using infrared radiation. Examples of usable infrared-absorbing substance include those exemplified in the description of the heat-sensitive mask layer (I). To improve the coatability, wettability, and peelability, the peel assist layer may contain surfactants. Particularly, when the peel assist layer (K) contains a phosphate ester-based surfactant, the peelability from the cover film (H) is improved.

The thickness of the peel assist layer (K) is preferably 6 μm or less, and more preferably 1 μm or less. If the thickness is 1 μm or less, laser melt-removability of the heat-sensitive mask layer (I) is not degraded. The thickness is preferably 0.1 μm or more since the peel assist layer (K) is easily formed.

Next, description will be made of a photosensitive resin composition and a method of manufacturing a photosensitive resin printing plate precursor. For example, a compound (A1), a compound (A1-1), and a compound (B) are dissolved in a water/alcohol mixed solvent with heating, and then a compound (C), a component (D), and, if necessary, plasticizers and other additives are added, followed by sufficient mixing with stirring to obtain a photosensitive resin composition solution for a printing surface layer. In the same manner as mentioned above, except that the compound (A1) and the compound (A1-1) are changed to a compound (A2), a photosensitive resin composition solution for an underlayer is obtained.

The thus obtained photosensitive resin composition solution for an underlayer is cast on a substrate (E) optionally having an adhesion-improving layer (G) and dried to form an underlayer (F1). Thereafter, the thus obtained photosensitive resin composition solution for a printing surface layer is cast thereon and dried to form a printing surface layer (F2), thus forming a photosensitive resin layer (F) consisting of two layers of the underlayer (F1) and the printing surface layer (F2). Furthermore, a cover film (H) optionally coated with an anti-adhesion layer is tightly adhered onto the photosensitive resin layer (F), thus obtaining a photosensitive printing plate precursor.

Alternatively, a photosensitive resin printing plate precursor can also be obtained by preparing a photosensitive resin sheet by dry film formation and then laminating the substrate (E) and the cover film (H) such that the photosensitive resin sheet is sandwiched therebetween.

When the photosensitive resin printing plate precursor includes the heat-sensitive mask layer (I), the method of forming the heat-sensitive mask layer (I) is not particularly limited. For example, the heat-sensitive mask layer (I) can be formed by dissolving and diluting a resin containing carbon black dispersed therein with an appropriate solvent, coating the resulting solution on the photosensitive resin layer (F), and then drying the solvent. Alternatively, the heat-sensitive mask layer (I) can also be formed by coating the above-mentioned carbon black solution on the cover film (H) and then laminating this cover film (H) and the substrate (E) such that the photosensitive resin layer (F) is sandwiched therebetween.

When the photosensitive resin printing plate precursor includes the adhesion-adjusting layer (J), the method of forming the adhesion-adjusting layer (J) is not particularly restricted. From the viewpoint of the simplicity of forming a thin film, the method, which is particularly preferably employed, is a method in which a solution prepared by dissolving components constituting the adhesion-adjusting layer (J) in a solvent is coated on the heat-sensitive mask layer (I) and the solvent is removed. Examples of a method of removing the solvent include hot-air drying, far-infrared drying, natural drying and the like. The solvent used is not particularly limited, and water, an alcohol, or a mixture of water and an alcohol is preferably used. When using water or an alcohol, the heat-sensitive mask layer (I) is preferably insoluble in water since the heat-sensitive mask layer (I) is not corroded by the solvent even if the solvent is coated on the heat-sensitive mask layer (I).

When the photosensitive resin printing plate precursor includes the peel assist layer (K), the method of forming the peel assist layer (K) is not particularly restricted. From the viewpoint of the simplicity of forming a thin film, the method, which is particularly preferably employed, is a method in which a solution prepared by dissolving components constituting the peel assist layer (K) in a solvent is coated on cover film (H) and the solvent is removed. Examples of a method of removing the solvent include hot-air drying, far-infrared drying, natural drying and the like. The solvent used to dissolve the peel assist layer (K) component is not particularly limited, and water, an alcohol, or a mixture of water and an alcohol is preferably used.

Next, a method of manufacturing a printing plate will be described.

In accordance with the analog plate-making method and the CTP plate-making method, a printing plate can be manufactured by sequentially passing through the steps of (1) applying activating light to a photosensitive resin printing plate precursor to selectively cross-link portions of a photosensitive resin layer which are to form a relief, and then (2) removing the resin layer of the uncross-linked portion to obtain a relief.

For example, when the photosensitive resin printing plate precursor does not include the heat-sensitive mask layer (I) (hereinafter referred to as the "analog plate") but includes the cover film (H), a negative or positive original image film is tightly adhered onto the photosensitive resin layer (F) after peeling off the cover film (H), and then the original image film is radiated with ultraviolet light to photocure the photosensitive resin layer (F).

When the photosensitive resin printing plate precursor includes the heat-sensitive mask layer (I) (hereinafter referred to as the CTP plate), after peeling off the cover film (H), an image corresponding to an original image film is drawn using a laser imaging apparatus and the thus drawn image is subsequently radiated with ultraviolet light to photocure the photosensitive resin layer (F).

The ultraviolet light radiation is usually performed using, for example, a high-pressure mercury lamp, an ultrahigh-pressure mercury lamp, a metal halide lamp, a xenon lamp, a carbon arc lamp, or a chemical lamp, which is capable of emitting light having a wavelength of 300 to 400 nm. Particularly, when the reproducibility of fine lines and dots is required, it is also possible to perform exposure from the side of the support (E) (back exposure) for a short time before peeling off the cover film (H).

Then, the thus exposed photosensitive resin printing plate precursor is immersed in a developer and a relief image is formed on a substrate using a brush-type development apparatus which removes uncured portion by rubbing with a brush. It is also possible to use a spray-type development apparatus in place of a brush-type development apparatus. Water or water containing a surfactant added therein can be used as the developer. The temperature of the developer during development is preferably 15 to 40° C.

After formation of a relief image, the resulting plate precursor is dried at 50 to 70° C. for about 10 minutes and is optionally subjected to a treatment with activating light in air or vacuum, thus a resin printing plate can be obtained.

In accordance with the laser engraving plate-making method, a printing plate can be manufactured by sequentially passing through the steps of (1) cross-linking a photosensitive resin printing plate precursor to obtain a cross-linked printing plate precursor, and then (2) applying patterned laser radiation to the cross-linked plate precursor to engrave a resin layer, thus obtaining a relief step.

Optionally, the method may further include the following steps: subsequently to the step (2), (3) rinsing the relief with water or a liquid containing water, (4) drying the relief obtained by engraving to vaporize the rinsing liquid, and then (5) applying activating light to the relief for further cross-linking.

The step (1) is the step of photocross-linking the photosensitive resin layer (F) by applying activating light. Examples of the activating light include visible light, ultraviolet light, electron beams and the like, and ultraviolet light is most common. The ultraviolet light radiation is usually performed using, for example, a high-pressure mercury lamp, an ultrahigh pressure mercury lamp, a metal halide lamp, a xenon lamp, a carbon arc lamp, or a chemical lamp, which can usually apply light having a wavelength of 300 to 400 nm. When a transparent cover film (H) which transmits activating light is provided, the step of applying activating light may be performed before or after peeling off the cover film (H). When the cover film (H) does not transmit activating light, the radiation is performed after peeling off the cover film (H). The activating light may be applied with a vinyl chloride film put on the photosensitive resin layer (F) and the air removed with a vacuum pump because polymerization inhibition may occur in the presence of oxygen. If the substrate (E) side of the relief is back side, activating light may be applied only to the front side. However, if the substrate (E) is a transparent film which transmits activating light, the activating light can also be applied from the back side.

Cross-linking the photosensitive resin printing plate precursor is advantageous in that, firstly, it sharpens the relief formed after laser engraving, and secondly, it inhibits the stickiness of engraving residues produced during laser engraving. If an uncross-linked photosensitive resin printing plate precursor is subjected to laser engraving, portions originally not intended are likely to be melted and deformed by the after-heat transferred to the surroundings of laser-radiated areas, and a sharp relief cannot be achieved. In general, materials with a lower molecular weight have the property of taking the form of a liquid rather than a solid, i.e., being stickier. Engraving residues produced during engraving a cross-linked printing plate precursor are stickier when materials with a lower molecular weight are used in larger amounts. The compound (C), which is low-molecular-weight, becomes a polymer by being cross-linked, and therefore, residues produced after engraving tend to be less sticky.

The step (2) of subjecting the photosensitive resin layer of the cross-linked plate precursor to laser engraving is carried out, for example, by providing scan illumination to a cross-linked printing plate precursor with a laser head controlled using a computer based on the digital data of an image to be formed. Upon radiation with an infrared laser, molecules in the cross-linked plate precursor vibrate to generate heat. When using a high-power laser such as a carbon dioxide laser or a YAG laser as the infrared laser, a large amount of heat is generated at the laser-radiated area, and molecules in the cross-linked plate precursor are broken or ionized; consequently, some portion of the cross-linked plate precursor is selectively removed, that is, engraving is achieved.

The advantage of the laser engraving plate-making method is that the depth of engraving can be freely selected, which allows a three-dimensionally controlled structure. For example, portions to print fine half tone dots can be engraved shallowly or into a shape with shoulders so that a relief does not fall over under printing pressure. Groove portions to print fine reverse texts can be engraved deeply so that the groove is less likely to be filled with ink, and deformation of reverse texts is prevented.

When engraving residues are attached to the engraved surface, the step (3) of rinsing the relief surface with a liquid to wash away the engraving residues is carried out. The rinsing may be carried out, for example, by washing away with a liquid flow, spraying a high-pressure liquid, or brushing the engraved surface in the presence of a liquid using a batch-type or conveyance-type brushing washout machine known as a development apparatus for a photosensitive resin letterpress printing plate. If the slime of the engraving residues cannot be removed, a rinsing liquid containing soap added therein may be used.

When the step (3) of rinsing the relief with water or a liquid containing water is performed, it is preferable to add the step (4) of drying the relief formed by engraving to evaporate the rinsing liquid.

Furthermore, the step (5) of further cross-linking the relief may be optionally added. This additional cross-linking step (5) can strengthen the relief formed by engraving.

The printing plate manufactured using the photosensitive resin printing plate precursor is most suitably used for letterpress printing and dry offset printing using a rotary printing press for label printing or an intermittent rotary printing press, and can also be used for planographic printing, intaglio printing, and mimeographic printing, and as a photoresist.

EXAMPLES

Our precursors and methods will be described in detail below by way of Examples. In the Examples, mention is made of an example of a photosensitive resin printing plate precursor and a printing plate, each having a type D durometer hardness of 55° which is a plate surface hardness of a printing plate to be used preferably in a rotary printing press for label printing or an intermittent rotary printing press which is likely to cause chemical stress crack. It should be understood, however, that the intention is not to limit this disclosure to such plate surface hardness or printing applications.

Preparation of Partially Saponified Polyvinyl Acetate Derivative (Compound (A))

Synthesis Example 1

A partially saponified polyvinyl acetate "KL-05" (degree of polymerization: approximately 500, degree of saponification: 80 mol %) manufactured by Nippon Synthetic Chemical Industry Co., Ltd. was swollen in acetone, and 1.0 mol % of succinic anhydride was added thereto. The resulting mixture was stirred at 60° C. for 6 hours to add carboxyl groups to a molecular side chain. This polymer was washed with acetone to remove unreacted succinic anhydride and further dried. The acid value of the thus obtained polymer was measured and found to be 10.0 mg KOH/g. One hundred parts by mass of this polymer was dissolved in 200 parts by mass of a mixed solvent of ethanol/water (mass ratio: 30/70) at 80° C. Six parts by mass of glycidyl methacrylate was added thereto to introduce functional groups into the partially saponified polyvinyl acetate. A potentiometric titration analysis performed using a potentiometric titrator 877 TITRINO PLUS (registered trademark) (Metrohm Japan Ltd.) revealed that methacroyl groups were introduced into a polymer side chain as a result of a reaction of the carboxyl groups in the polymer with epoxy groups of glycidyl methacrylate. In such a manner, a partially saponified polyvinyl acetate derivative having an average polymerization degree of 500 was obtained as the compound (A).

In the same manner as mentioned above, except that a partially saponified polyvinyl acetate having an average polymerization degree of 1,000 (Denka Company Limited DENKA POVAL (registered trademark) MP-10) and a partially saponified polyvinyl acetate having an average polymerization degree of 2,200 (The Nippon Synthetic Chemical Industry Co., Ltd. GOHSENOL (registered trademark) KH-17) were used, a reaction was performed to obtain partially saponified polyvinyl acetate derivatives each having an average polymerization degree of 1,000 and 2,200.

The average polymerization degree of the compound (A) was confirmed in accordance with the method for the measurement of average polymerization degree mentioned in "3. Testing methods" of JIS K 6726:1994 "Testing methods for polyvinyl alcohol". Namely, the non-saponified portion (remaining acetic acid group) was completely saponified in advance with sodium hydroxide in a water bath at 40° C.±2° C. The relative viscosity with water was measured at the measurement temperature of 25° C.±0.1° C. using an Ostwald viscometer and then calculated by the calculating formula mentioned in "3. Testing methods". Using the results, the average polymerization degree was calculated by the calculating formula mentioned in "3. Testing methods".

Synthesis of Polyamide Having Basic Nitrogen (Compound (B))

Synthesis Example 2

In a stainless steel autoclave, 10 parts by mass of ε-caprolactam, 90 parts by mass of a nylon salt of N-(2-aminoethyl) piperazine and adipic acid, and 100 parts by mass of water were charged and the internal air was replaced with a nitrogen gas. After heating at 180° C. for 1 hour, moisture was removed to obtain a polyamide having basic nitrogen as a water-soluble polyamide resin.

Preparation of Substrate (E) Having Adhesion-Improving Layer (G)

A mixture of 260 parts by mass of "VYLON" (registered trademark) 31SS (solution of unsaturated polyester resin in toluene, manufactured by Toyobo Co., Ltd.) and 2 parts by mass of "PS-8A" (benzoin ethyl ether, manufactured by Wako Pure Chemical Industries, Ltd.) was heated at 70° C. for 2 hours, and then cooled to 30° C. Seven parts by mass of ethylene glycol diglycidyl ether was added, followed by mixing for 2 hours. Furthermore, 25 parts by mass of "CORONATE" (registered trademark) 3015E (solution of polyisocyanate resin in ethyl acetate, manufactured by Nippon Polyurethane Industry Co., Ltd.) and 14 parts by mass of "EC-1368" (industrial adhesive, manufactured by Sumitomo 3M Limited) were added and mixed to obtain a coating solution 1 for an adhesion-improving layer (G).

Fifty parts by mass of "GOHSENOL" (registered trademark) KH-17 (polyvinyl alcohol having a degree of saponification of 78.5 to 81.5 mol %, manufactured by Nippon Synthetic Chemical Industry Co., Ltd.) was mixed with a mixed solvent of 200 parts by mass of "SOLMIX" (registered trademark) H-11 (alcohol mixture, manufactured by Japan Alcohol Trading Co., Ltd.) and 200 parts by mass of water at 70° C. for 2 hours, and then 1.5 parts by mass of "BLEMMER" (registered trademark) G (glycidyl methacrylate, manufactured by NOF Corporation) was added, followed by mixing for 1 hour. Furthermore, 3 parts by mass of a copolymer of (dimethylaminoethyl methacrylate)/(2-hydroxyethyl methacrylate) at a weight ratio of 2/1 (manufactured by Kyoeisha Chemical Co., Ltd.), 5 parts by mass of "IRGACURE" (registered trademark) 651 (benzyl dimethyl ketal, manufactured by Nihon Ciba-Geigy K.K.), 21 parts by mass of "epoxy ester 70PA" (acrylic acid adduct of propylene glycol diglycidyl ether, manufactured by Kyoeisha Chemical Co., Ltd.), and 20 parts by mass of ethylene glycol diglycidyl ether dimethacrylate were added, followed by mixing for 90 minutes. After cooling to 50° C., 0.1 part by mass of "MEGAFAC" (registered trademark) F-470 (manufactured by DIC Corporation) was added, followed by mixing for 30 minutes to obtain a coating solution 2 for an adhesion-improving layer (G).

On "LUMIRROR" (registered trademark) T60 (polyester film, manufactured by Toray Industries Inc.) having a thickness of 250 the coating solution 1 for an adhesion-improving layer (G) was applied using a bar coater such that the dry thickness would be 40 and heated in an oven at 180° C. for 3 minutes to remove the solvent. On the coated film, the coating solution 2 for an adhesion-improving layer (G) was applied using a bar coater such that the dry thickness would be 30 and heated in an oven at 160° C. for 3 minutes to obtain a substrate (E) with an adhesion-improving layer (G).

Preparation of Cover Film (H1) for Analog Plate and Laser Engraving Plate

On "LUMIRROR (registered trademark)" S10 (polyester film, manufactured by Toray Industries Inc.) having a thickness of 100 μm roughened to have a surface roughness Ra of 0.1 to 0.6 μm, "GOHSENOL (registered trademark)" AL-06 (partially saponificated polyvinyl alcohol having a degree of saponification of 91 to 94 mol %, manufactured by Nippon Synthetic Chemical Industry Co., Ltd.) was applied such that the dry thickness would be 1 and dried at 100° C. for 25 seconds to obtain a cover film H1 for an analog plate and a laser engraving plate.

Preparation of Cover Film (H2) for CTP Plate

In a mixture of 40 parts by mass of water, 20 parts by mass of methanol, 20 parts by mass of n-propanol, and 10 parts by mass of n-butanol, 10 parts by mass of "GOHSENOL (registered trademark)" KL-05 (polyvinyl alcohol having a saponification degree of 78 to 82 mol %, manufactured by The Nippon Synthetic Chemical Industry Co., Ltd.) was dissolved to obtain a coating solution for an adhesion-adjusting layer (J).

A mixture of 23 parts by mass of "MA-100" (carbon black, manufactured by Mitsubishi Chemical Corporation), 1 part by mass of "DIANAL (registered trademark)" BR-95 (alcohol-insoluble acrylic resin, manufactured by Mitsubishi Rayon Co., Ltd.), 6 parts by mass of a plasticizer "ATBC" (acetyl tributyl citrate, manufactured by J-PLUS Co., Ltd.), and 30 parts by mass of diethylene glycol monoethyl ether monoacetate, which was prepared in advance, was kneaded and dispersed using a 3-roll mill to prepare a carbon black dispersion. To the thus obtained carbon black dispersion, 20 parts by mass of "ARALDITE 6071" (epoxy resin, manufactured by Asahi Ciba Co., Ltd.), 27 parts by mass of "U-VAN (registered trademark)" 62 (melamine resin, manufactured by Mitsui Chemicals, Inc.), 0.7 part by mass of "LIGHT ESTER" (registered trademark) P-1M (phosphate monomer, manufactured by Kyoeisha Chemical Co., Ltd.), and 140 parts by mass of methyl isobutyl ketone were added, followed by stirring for 30 minutes. Then, methyl isobutyl ketone was further added to adjust a solid concentration to 33% by mass, thus obtaining a coating solution for a heat-sensitive mask layer (I).

In a mixture of 55 parts by mass of water, 14 parts by mass of methanol, 10 parts by mass of n-propanol, and 10 parts by mass of n-butanol, 11 parts by mass of "GOHSENOL (registered trademark)" AL-06 (polyvinyl alcohol having a saponification degree of 91 to 94 mol %, manufactured by The Nippon Synthetic Chemical Industry Co., Ltd.) was dissolved to obtain a coating solution for a peel assist layer (K).

As a cover film (H), a 100 μm-thick "LUMIRROR (registered trademark)" S10 (polyester film, manufactured by Toray Industries Inc.) having a surface not subjected to a roughening treatment was used. On the cover film (H), the coating solution for a peel assist layer (K) was coated using a bar coater such that the dry thickness would be 0.25 μm, followed by drying at 100° C. for 25 seconds to obtain a laminate of peel assist layer (K)/cover film (H). On the side of the peel assist layer (K) of the thus obtained laminate, the coating solution for a heat-sensitive mask layer (I) was coated using a bar coater such that the dry thickness would be 2 μm, followed by drying at 140° C. for 30 seconds to obtain a laminate of heat-sensitive mask layer (I)/peel assist layer (K)/cover film (H). On the side of the heat-sensitive mask layer (I) of the thus obtained laminate, the coating solution for an adhesion-adjusting layer (J) was coated using a bar coater such that the dry thickness would be 1 μm, followed by drying at 180° C. for 30 seconds to obtain a cover film H2 for a CTP plate, which had a structure of adhesion-adjusting layer (J)/heat-sensitive mask layer (I)/peel assist layer (K)/cover film (H). The optical density (using an orthochromatic filter, transmission mode) of this cover film H2 (laminate of J/I/K/H), which was determined taking the value of the cover film H as 0, was 3.6.

Evaluation Method

Evaluations in Examples and Comparative Examples were performed by the following methods.

(1) Image Reproducibility of Analog Plate

From a 10 cm×10 cm photosensitive resin printing plate precursor for an analog plate, only the polyester film of the cover film (H1) was peeled off (after peeling, the partially saponified polyvinyl alcohol layer having a dry thickness of 1 μm constituted the outermost surface of the photosensitive resin printing plate precursor), and a gray-scale negative film for sensitivity measurement and a negative film for evaluation of image reproducibility (having 150-line 4% half tone dot and dots having a diameter of 200 μm) were vacuum-adhered thereto. The resulting printing plate precursor was exposed using a chemical lamp 20-Watt FL20SBL-360 (manufactured by Mitsubishi Electric Osram Ltd.) under such a condition that a gray-scale sensitivity of 16±1 steps was attained (main exposure). Thereafter, using a brush-type development apparatus, the thus exposed plate precursor was developed with water at a developer temperature of 25° C. and then dried at 60° C. for 10 minutes. Thereafter, the resulting printing plate precursor was further subjected to post exposure using the chemical lamp 20-Watt FL-20SBL-360 (manufactured by Mitsubishi Electric Osram Ltd.) under the same conditions as in the main exposure to obtain a printing plate for evaluation of image reproducibility.

For each of the thus obtained printing plates, the half tone dot and dots were evaluated.

Half tone dot: A 150-line 4% half tone dot formed in an area of 1 cm×1 cm was observed using a magnifying glass at a magnification of 20 times. Based on the following scoring criteria, it was evaluated whether the half tone dot was reproduced at a site of tight adhesion with a negative film. A score of 4 or higher was determined to be pass.

5: No missing of the half tone dot was observed.
4: Missing of the half tone dot was observed in the area of the outermost periphery.
3: Missing of the half tone dot was observed in the areas of the outermost periphery and the second row therefrom.
2: Missing of the half tone dot was observed in the interior area including the third row from the outermost periphery.
1: Missing of the half tone dot was observed in 20% or more of the entire half tone dot area.

Dots: Three dots having a diameter of 200 μm were visually observed and the number of the reproduced dots was measured. When all three dots were reproduced was determined to be pass.

(2) Image Reproducibility of CTP Plate

From a 10 cm×10 cm photosensitive resin printing plate precursor for a CTP plate, only the polyester film of the cover film (H2) was peeled off and a chart for evaluation of image reproducibility (having 175-line 2% half tone dot and dots having a diameter of 140 μm) was drawn at laser energy of 2.0 J/cm$^2$ using a laser drawing machine CDI2120 (manufactured by Esko-Graphics). The resulting printing plate precursor was exposed for 6 minutes using a chemical lamp 20-Watt FL20SBL-360 (manufactured by Mitsubishi Electric Osram Ltd.) (main exposure). Thereafter, using a brush-type development apparatus, the thus exposed plate precursor was developed with water at a developer temperature of 25° C. and then dried at 60° C. for 10 minutes. Thereafter, the resulting printing plate precursor was further subjected to post exposure using the chemical lamp 20-Watt FL-20SBL-360 (manufactured by Mitsubishi Electric Osram Ltd.) under the same conditions as in the main exposure to obtain a printing plate for evaluation of image reproducibility.

For each of the thus obtained printing plates, the half tone dot and dots were evaluated.

Half tone dot: A 175-line 2% half tone dot formed in an area of 1 cm×1 cm was observed using a magnifying glass at a magnification of 20 times. Based on the following scoring criteria, it was evaluated whether the half tone dot was reproduced at a site of tight adhesion with a negative film. A score of 4 or higher was determined to be pass.
5: No missing of the half tone dot was observed.
4: Missing of the half tone dot was observed in the area of the outermost periphery.
3: Missing of the half tone dot was observed in the areas of the outermost periphery and the second row therefrom.
2: Missing of the half tone dot was observed in the interior area including the third row from the outermost periphery.
1: Missing of the half tone dot was observed in 20% or more of the entire half tone dot area.

Dots: Three dots having a diameter of 140 μm were visually observed and the number of the reproduced dots was measured. When all three dots were reproduced was determined to be pass.

(3) Image Reproducibility of Laser Engraving Plate

A 950 μm-thick photosensitive printing plate precursor, from which a cover film (H1) was removed, was exposed overall (exposure: 2,400 mJ/cm$^2$) from the side of the cover film (H1) in an ambient atmosphere using a platemaker DX-A3 (manufactured by Takano Machinery Works Co., Ltd.) equipped with chemical lamps FL20SBL-360 (20 W) (manufactured by Osram Mitsubishi Electric). Thereafter, only the polyester film of the cover film (H1) was peeled off. The resin layer was engraved by applying patterned laser radiation to the cross-linked plate precursor using Adflex Direct 250L (manufactured by Comtecs Co., Ltd.) to form a relief with 1% to 5% half tone dots of 133 Lpi. The engraving rate was set at 1,000 cm/s, and a laser scanning width was set at 10 μm.

A conceptual diagram of a cross section of the thus obtained relief is shown in the FIGURE. Engraving was performed under the conditions of Top 1 of 10%, Bottom 2 of 100%, and Width 3 of 0.3 mm in the relief cross section of the FIGURE.

Thereafter, the printing plate precursor was rinsed with tap water at 25° C. for 30 seconds using the platemaker DX-A3, and then dried with a hot-air dryer at 60° C. for 10 minutes. The printing plate precursor was exposed overall (exposure: 2,400 mJ/cm$^2$) again in an ambient atmosphere using the chemical lamps to obtain a printing plate for evaluating image reproducibility.

For the printing plate thus obtained, the presence of engraving residues after rinsing and half tone dot reproducibility were observed by a loupe at a magnification of 25 times. For the half tone dot reproducibility, minimum half tone dot (%) was evaluated.

(4) Evaluation of Crack Occurrence in Relief (Printing Durability)

For an analog plate, from a 10 cm×10 cm photosensitive resin printing plate precursor for an analog plate, only the polyester film of the cover film (H1) was peeled off and a negative film for evaluation of crack occurrence (having a circular solid image portion having a diameter of 12 mm) was vacuum-adhered thereto. The resulting printing plate precursor was exposed using a chemical lamp 20-Watt FL20SBL-360 (manufactured by Mitsubishi Electric Osram Ltd.) under such a condition that a gray-scale sensitivity of 16±1 steps was attained (main exposure). Thereafter, using a brush-type development apparatus, the thus exposed plate precursor was developed with water at a developer temperature of 25° C. and then dried at 60° C. for 10 minutes. Thereafter, the resulting printing plate precursor was further subjected to post exposure using the chemical lamp 20-Watt FL-20SBL-360 (manufactured by Mitsubishi Electric Osram Ltd.) under the same conditions as in the main exposure to obtain a printing plate having a plate thickness of 950 μm and a circular solid image portion having a diameter of 12 mm. After adjusting to a state where crack is likely to occur by applying steam to a plate surface, printing was performed using an intermittent rotary printing press LR3 (manufactured by Iwasaki Tekko Co., Ltd.) as a printing press, BEST CURE (registered trademark) UV161 Indigo S (manufactured by T&K TOKA CO., LTD.) as an ink, and a 90 μm-thickness double sided coated paper (manufactured by MARUU SECCHAKU Co., Ltd.) as a paper. A scale of a printing pressure adjusting handle was set at 5.05, and a printing speed was set at 100 m/minute. After printing 3,000 sheets, 5,000 sheets, 8,000 sheets, 11,000 sheets, and 15,000 sheets, a relief surface of a printing plate was observed by a loupe at a magnification of 25 times, and then it was evaluated whether crack occurred. When no crack occurred after printing 5,000 sheets was determined to be pass because of high durability, whereas, when crack occurred after printing 5,000 sheets was determined to be fail.

For a CTP plate, from a 10 cm×10 cm photosensitive resin printing plate precursor for a CTP plate, only the polyester film of the cover film (H2) was peeled off and drawing was performed at laser energy of 2.0 J/cm$^2$ using a laser drawing machine CDI2120 (manufactured by Esko-Graphics). The resulting printing plate precursor was exposed for 6 minutes using a chemical lamp 20-Watt FL20SBL-360 (manufactured by Mitsubishi Electric Osram Ltd.) (main exposure). Thereafter, using a brush-type development apparatus, the thus exposed plate precursor was developed with water at a developer temperature of 25° C. and then dried at 60° C. for 10 minutes. Thereafter, the resulting printing plate precursor was further subjected to post exposure using the chemical lamp 20-Watt FL-20SBL-360 (manufactured by Mitsubishi Electric Osram Ltd.) under the same conditions as in the main exposure to obtain a printing plate having a plate thickness of 950 μm and a circular solid image portion having a diameter of 12 mm. Evaluation of crack occurrence by printing was performed in the same manner as in the analog plate.

For a laser engraving plate, a photosensitive printing plate precursor for a laser engraving plate was exposed overall (exposure: 2,400 mJ/cm$^2$) from the side of the cover film (H1) in an ambient atmosphere using a platemaker DX-A3 (manufactured by Takano Machinery Works Co., Ltd.) equipped with chemical lamps FL20SBL-360 (20 W) (manufactured by Osram Mitsubishi Electric). Thereafter, only the polyester film of the cover film (H1) was peeled off. The resin layer was engraved by applying patterned laser radiation to the cross-linked plate precursor using Adflex Direct 250L (manufactured by Comtecs Co., Ltd.). Thereafter, using a brush-type development apparatus, the thus exposed plate precursor was developed with water at a developer temperature of 25° C. and then dried at 60° C. for 10 minutes. Thereafter, the resulting printing plate precursor was further subjected to post exposure using the chemical lamp 20-Watt FL-20SBL-360 (manufactured by Mitsubishi Electric Osram Ltd.) under the same conditions as in the main exposure to obtain a printing plate having a plate thickness of 950 μm and a circular solid image portion having a diameter of 12 mm. Evaluation of crack occurrence by printing was performed in the same manner as in the analog plate.

(5) Evaluation of Water Developability

In the same manner as in evaluation of image reproducibility, each of 10 cm×10 cm photosensitive resin printing plate precursors for an analog plate and a CTP plate was exposed based on a test pattern. Thereafter, using a brush-type development apparatus of a platemaker DX-A3 (manufactured by Takano Machinery Works Co., Ltd.), the thus exposed plate precursor was developed with water having a developer temperature of 25° C., and then the development time required until no resin remains on a substrate was evaluated. When the development time is within 125 seconds was determined to be pass because of high water developability, whereas, when the development time exceeds 125 seconds was determined to be fail because of poor water developability.

(6) Evaluation of Adhesion Between Printing Surface Layer and Underlayer of Laser Engraving Plate In the same manner as in (3), except that the pattern used to radiate the cross-linked printing plate precursor with laser was changed, a printing plate having a thin line of 200 μm in width and 10 cm in length was prepared. Thereafter, a relief surface of the printing plate was observed by a loupe at a magnification of 25 times, and then it was evaluated whether peeling occurred between the printing surface layer and the underlayer. When no peeling occurred was determined to be pass, whereas, when peeling occurred was determined to be fail.

(7) Type D Durometer Hardness

Using a photosensitive resin composition for a photosensitive resin layer, a 10 cm×10 cm photosensitive resin sheet having a thickness of 600 μm was obtained. Using a platemaker DX-A3 (manufactured by Takano Machinery Works Co., Ltd.) equipped with chemical lamps FL20SBL-360 (20 W) (manufactured by Osram Mitsubishi Electric), overall exposure (exposure: 2,400 mJ/cm$^2$) was performed in an ambient atmosphere to obtain a sample for measurement of durometer hardness. Thereafter, using a type D durometer, the durometer hardness of the sample was measured by the method defined in "8. Testing Methods" of Part 3: Durometer Hardness" of JIS K 6253-3:2012 "Rubber, vulcanized or thermoplastic-Determination of hardness". Herein, when the durometer hardness is 40 to 60°, which is the plate surface hardness of a printing plate to be preferably used in a rotary printing press for label printing or an intermittent rotary printing press, was determined to be pass.

(8) Comprehensive Judgment

When the results of all evaluation items were determined to be pass was determined to be "pass", whereas, when the results of some evaluation items were determined to be fail was determined to be "fail".

Example 1

Preparation of Photosensitive Resin Composition Solution 1 for Printing Surface Layer In a three-necked flask equipped with a stirring paddle and a condenser, the compound (A) synthesized in Synthesis Example 1 and the compound (B) synthesized in Synthesis Example 2 were added in the amount shown in Table 1, and a mixed solvent of 50 parts by mass of "SOLMIX" (registered trademark) H-11 (alcohol mixture, manufactured by Japan Alcohol Trading Co., Ltd.) and 50 parts by mass of water was added, and then the resulting mixture was heated at 90° C. for 2 hours with stirring to dissolve the compound (A) and the compound (B). Herein, the polymerization degree shown in Table 1 of the compound (A) was used. The mixture was cooled to 70° C., and then other components shown in Table 1 were added, followed by stirring for 30 minutes to obtain a photosensitive resin composition solution 1 for a printing surface layer.

Preparation of Photosensitive Resin Composition Solution 1 for Underlayer

In the same manner as in the photosensitive resin composition solution 1 for a printing surface layer, except that the compound (A) was changed to those shown in Table 1, a photosensitive resin composition solution 1 for an underlayer was obtained.

Preparation of Photosensitive Resin Printing Plate Precursor 1 for Analog Plate

The thus obtained photosensitive resin composition solution 1 for an underlayer was cast on the adhesion-improving layer (G) side of the above-mentioned substrate (E) having the adhesion-improving layer (G) and dried at 60° C. for 2.5 hours to form an underlayer. At this time, the thickness of the plate after being dried (polyester film+photosensitive resin layer) was controlled to be 0.90 mm. Thereafter, the photosensitive resin composition solution 1 for a printing surface layer was cast on the underlayer and then dried at 60° C. for 1 hour to form a printing surface layer. At this time, the thickness of the plate after being dried (polyester film+photosensitive resin layer) was controlled to be 0.95 mm.

On the thus obtained photosensitive resin layer, a mixed solvent (water/ethanol=50/50 (weight ratio)) was coated and the cover film (H1) for an analog plate was press-adhered to the surface to obtain a photosensitive resin printing plate precursor. The properties of the thus obtained photosensitive resin printing plate precursor were evaluated by the above-mentioned methods and the results thereof are shown in Table 1.

Example 2

Preparation of Photosensitive Resin Composition Solution 2 for Printing Surface Layer In the same manner as in Example 1, a photosensitive resin composition solution 2 for a printing surface layer was obtained.

Preparation of Photosensitive Resin Composition Solution 2 for Underlayer

In the same manner as in Example 1, a photosensitive resin composition solution 2 for an underlayer was obtained.

Manufacture of Photosensitive Resin Printing Plate Precursor 2 for CTP Plate

The thus obtained photosensitive resin composition solution 2 for an underlayer was cast on the adhesion-improving layer (G) side of the above-mentioned substrate (E) having the adhesion-improving layer (G) and then dried at 60° C. for 2.5 hours to form an underlayer. At this time, the thickness of the plate after being dried (polyester film+photosensitive resin layer) was controlled to be 0.90 mm. Thereafter, the photosensitive resin composition solution 2 for a printing surface layer was cast on the underlayer and dried at 60° C. for 1 hour to form a printing surface layer. At this time, the thickness of the plate after being dried (polyester film+photosensitive resin layer) was controlled to be 0.95 mm.

On the thus obtained photosensitive resin layer, a mixed solvent (water/ethanol=50/50 (weight ratio)) was coated and the cover film (H2) for a CTP plate was press-adhered to the surface to obtain a photosensitive resin printing plate precursor. The properties of the thus obtained photosensitive resin printing plate precursor were evaluated by the above-mentioned methods and the results thereof are shown in Table 1.

Examples 3 to 6, Comparative Examples 1 to 5

In the same manner as in Example 1, except that each component was changed to those shown in Tables 1 and 2, a photosensitive resin sheet and a photosensitive printing plate precursor were prepared. The evaluation results are shown in Tables 1 and 2.

TABLE 1

|  |  |  | Example 1 | Example 2 | Example 3 | Example 4 | Example 5 | Example 6 |
|---|---|---|---|---|---|---|---|---|
| Content (parts by mass) | Compound (A) |  | 50 | 50 | 50 | 50 | 50 | 50 |
|  | Compound (B) |  | 7.5 | 7.5 | 7.5 | 7.5 | 7.5 | 7.5 |
|  | Compound (C) | Glycerol dimethacrylate | 7 | 7 | 7 | 7 | 7 | 7 |
|  |  | Acrylic acid adduct of propylene glycol diglycidyl ether | 11 | 11 | 11 | 11 | 11 | 11 |
|  |  | Tetrahydrofurfuryl methacrylate | 10 | 10 | 10 | 10 | 10 | 10 |
|  | Component (D) | 2,2-dimethoxy-1,1-diphenylethan-1-one | 1.3 | 1.3 | 1.3 | 1.3 | 1.3 | 1.3 |
|  | Compatibilizing agent | Pentaerythritol polyoxyethylene ether | 10 | 10 | 10 | 10 | 10 | 10 |
|  | Polymerization inhibitor | N-(ammoniumoxy)-N-nitrosophenylamine | 0.2 | 0.2 | 0.2 | 0.2 | 0.2 | 0.2 |
| Component (A) | Printing surface layer | (A1) Polymerization degree | 2,200 | 2,200 | 2,200 | 2,200 | 2,200 | 2,200 |
|  |  | (A1) Presence of crosslinkable group | Exist | Exist | Exist | Exist | Exist | Exist |
|  |  | (A1-1) Polymerization degree | 500 | 500 | 500 | — | 1000 | 1000 |
|  |  | (A1):(A1-1) (mass ratio) | 50:50 | 50:50 | 75:25 | 100:0 | 50:50 | 75:25 |
|  | Underlayer | (A2) Polymerization degree | 500 | 500 | 500 | 500 | 500 | 500 |
|  |  | (A2) Presence of crosslinkable group | Exist | Exist | Exist | Exist | Exist | Exist |
|  |  | Other (A) Polymerization degree | — | — | — | — | — | — |
|  |  | (A2):Other (A) (mass ratio) | 100:0 | 100:0 | 100:0 | 100:0 | 100:0 | 100:0 |
| Evaluation results | Image reproducibility | Half tone dot reproducibility | 4 | 4 | 4 | 4 | 4 | 4 |
|  |  | Dot reproduction number | 3 | 3 | 3 | 3 | 3 | 3 |
|  | Evaluation of crack occurrence in relief | 3,000 | Pass | Pass | Pass | Pass | Pass | Pass |
|  |  | 5,000 | Pass | Pass | Pass | Pass | Pass | Pass |
|  |  | 8,000 | Fail | Fail | Pass | Pass | Pass | Pass |
|  |  | 11,000 | Fail | Fail | Fail | Pass | Fail | Pass |
|  |  | 15,000 | Fail | Fail | Fail | Pass | Fail | Fail |
|  | Water development time (second) |  | 105 | 115 | 110 | 120 | 110 | 115 |
|  | Type D durometer hardness (°) |  | 55 | 55 | 55 | 55 | 55 | 55 |
|  | Comprehensive judgment |  | Pass | Pass | Pass | Pass | Pass | Pass |

TABLE 2

|  |  |  | Comparative Example 1 | Comparative Example 2 | Comparative Example 3 | Comparative Example 4 | Comparative Example 5 |
|---|---|---|---|---|---|---|---|
| Content (parts by mass) | Compound (A) |  | 50 | 50 | 50 | 50 | 50 |
|  | Compound (B) |  | 7.5 | 7.5 | 7.5 | 7.5 | 7.5 |
|  | Compound (C) | Glycerol dimethacrylate | 7 | 7 | 7 | 7 | 7 |
|  |  | Acrylic acid adduct of propylene glycol diglycidyl ether | 11 | 11 | 11 | 11 | 11 |
|  |  | Tetrahydrofurfuryl methacrylate | 10 | 10 | 10 | 10 | 10 |
|  | Component (D) | 2,2-dimethoxy-1,1-diphenylethan-1-one | 1.3 | 1.3 | 1.3 | 1.3 | 1.3 |
|  | Compatibilizing agent | Pentaerythritol polyoxyethylene ether | 10 | 10 | 10 | 10 | 10 |
|  | Polymerization inhibitor | N-(ammoniumoxy)-N-nitrosophenylamine | 0.2 | 0.2 | 0.2 | 0.2 | 0.2 |
| Component (A) | Printing surface layer | (A1) Polymerization degree | — | — | 2,200 | 2,200 | 1,000 |
|  |  | (A1) Presence of crosslinkable group | — | — | Exist | Exist | Exist |
|  |  | (A1-1) Polymerization degree | 500 | 1,000 | — | 500 | 500 |
|  |  | (A1):(A1-1) (mass ratio) | 0:100 | 0:100 | 100:0 | 50:50 | 25:75 |
|  | underlayer | (A2) Polymerization degree | 500 | — | — | — | 500 |
|  |  | (A2) Presence of crosslinkable group | Exist | — | — | — | Exist |
|  |  | Other (A) Polymerization degree | — | 1000 | 2,200 | 1000 | — |
|  |  | (A2):Other (A) (mass ratio) | 100:0 | 0:100 | 0:100 | 0:100 | 100:0 |
| Evaluation results | Image reproducibility | Half tone dot reproducibility | 4 | 4 | 4 | 4 | 4 |
|  |  | Dot reproduction number | 3 | 3 | 3 | 3 | 3 |
|  | Evaluation of crack occurrence in relief | 3,000 | Fail | Pass | Pass | Pass | Pass |
|  |  | 5,000 | Fail | Fail | Pass | Pass | Fail |

TABLE 2-continued

|  |  | Comparative Example 1 | Comparative Example 2 | Comparative Example 3 | Comparative Example 4 | Comparative Example 5 |
|---|---|---|---|---|---|---|
|  | 8,000 | Fail | Fail | Pass | Fail | Fail |
|  | 11,000 | Fail | Fail | Pass | Fail | Fail |
|  | 15,000 | Fail | Fail | Pass | Fail | Fail |
| Water development time (second) |  | 100 | 500 | 850 | 400 | 105 |
| Type D durometer hardness (°) |  | 55 | 55 | 50 | 55 | 55 |
| Comprehensive judgment |  | Fail | Fail | Fail | Fail | Fail |

Example 7

Preparation of Photosensitive Resin Composition Solution 3 for Printing Surface Layer In the same manner as in Example 1, except that each component was changed to those shown in Table 3, a photosensitive resin composition solution 3 for a printing surface layer was obtained.

Preparation of Photosensitive Resin Composition Solution 3 for Underlayer

In the same manner as in Example 1, except that each component was changed to those shown in Table 3, a photosensitive resin composition solution for an underlayer 3 was obtained. Manufacture of photosensitive resin printing plate precursor 3 for laser engraving plate The thus obtained photosensitive resin composition solution 3 for an underlayer was cast on the adhesion-improving layer (G) side of the above-mentioned substrate (E) having the adhesion-improving layer (G) and dried at 60° C. for 2.5 hours to form an underlayer. At this time, the thickness of the plate after being dried (polyester film+photosensitive resin layer) was controlled to be 0.90 mm. Thereafter, the photosensitive resin composition solution 3 for a printing surface layer was cast on the underlayer and then dried at 60° C. for 1 hour to form a printing surface layer. At this time, the thickness of the plate after being dried (polyester film+photosensitive resin layer) was controlled to be 0.95 mm.

On the thus obtained photosensitive resin layer, a mixed solvent (water/ethanol=50/50 (weight ratio)) was coated and the cover film (H1) for a laser engraving plate was press-adhered to the surface to obtain a photosensitive resin printing plate precursor. The properties of the thus obtained photosensitive resin printing plate precursor were evaluated by the above-mentioned methods and the results thereof are shown in Table 3.

Examples 8 to 12, Comparative Examples 6 to 9

In the same manner as in Example 7, except that each component was changed to those shown in Tables 3 and 4, a photosensitive resin sheet and a photosensitive printing plate precursor were prepared. The evaluation results are shown in Tables 3 and 4.

TABLE 3

|  |  |  | Example 7 | Example 8 | Example 9 | Example 10 | Example 11 | Example 12 |
|---|---|---|---|---|---|---|---|---|
| Content (parts by mass) | Compound (A) |  | 50 | 50 | 50 | 50 | 50 | 50 |
|  | Compound (B) |  | 7.5 | 7.5 | 7.5 | 7.5 | 7.5 | 7.5 |
|  | Compound (C) | Glycerol dimethacrylate | 7 | 7 | 7 | 7 | 7 | 7 |
|  |  | Acrylic acid adduct of propylene glycol diglycidyl ether | 11 | 11 | 11 | 11 | 11 | 11 |
|  |  | Tetrahydrofurfuryl methacrylate | 10 | 10 | 10 | 10 | 10 | 10 |
|  | Component (D) | 2,2-dimethoxy-1,1-diphenylethan-1-one | 1.3 | 1.3 | 1.3 | 1.3 | 1.3 | 1.3 |
|  | Compatibilizing agent | Pentaerythritol polyoxyethylene ether | 10 | 10 | 10 | 10 | 10 | 10 |
|  | Polymerization inhibitor | N-(ammoniumoxy)-N-nitrosophenylamine | 0.2 | 0.2 | 0.2 | 0.2 | 0.2 | 0.2 |
| Component (A) | Printing surface layer | (A1) Polymerization degree | 2,200 | 2,200 | 2,200 | 2,200 | 2,200 | 2,200 |
|  |  | (A1) Presence of crosslinkable group | Exist | Exist | Exist | Not exist | Not exist | Not exist |
|  |  | (A1-1) Polymerization degree | — | 500 | 500 | — | 500 | 500 |
|  |  | (A1):(A1-1) (mass ratio) | 100:0 | 75:25 | 50:50 | 100:0 | 75:25 | 50:50 |
|  | underlayer | (A2) Polymerization degree | 500 | 500 | 500 | 500 | 500 | 500 |
|  |  | (A2) Presence of crosslinkable group | Exist | Exist | Exist | Not exist | Not exist | Not exist |
|  |  | Other (A) Polymerization degree | — | — | — | — | — | — |
|  |  | (A2):Other (A) (mass ratio) | 100:0 | 100:0 | 100:0 | 100:0 | 100:0 | 100:0 |
|  | Image reproducibility | minimum half tone dot reproducibility (%) | 1 | 1 | 1 | 1 | 1 | 1 |
|  |  | Presence of engraving residue after rinsing | None | None | None | None | None | None |
|  | Evaluation of crack occurrence in relief | 3,000 | Pass | Pass | Pass | Pass | Pass | Pass |
|  |  | 5,000 | Pass | Pass | Pass | Pass | Pass | Pass |
|  |  | 8,000 | Pass | Pass | Pass | Pass | Pass | Pass |
|  |  | 11,000 | Pass | Pass | Fail | Pass | Pass | Fail |
|  |  | 15,000 | Pass | Fail | Fail | Pass | Fail | Fail |
|  | Evaluation of adhesion between printing surface layer and underlayer of laser engraved plate |  | Pass | Pass | Pass | Pass | Pass | Pass |
|  | Type D durometer hardness (°) |  | 55 | 55 | 55 | 55 | 55 | 55 |
|  | Comprehensive judgment |  | Pass | Pass | Pass | Pass | Pass | Pass |

TABLE 4

| | | | Comparative Example 6 | Comparative Example 7 | Comparative Example 8 | Comparative Example 9 |
|---|---|---|---|---|---|---|
| Content (parts by mass) | Compound (A) | | 50 | 50 | 50 | 50 |
| | Compound (B) | | 7.5 | 7.5 | 7.5 | 7.5 |
| | Compound (C) | Glycerol dimethacrylate | 7 | 7 | 7 | 7 |
| | | Acrylic acid adduct of propylene glycol diglycidyl ether | 11 | 11 | 11 | 11 |
| | | Tetrahydrofurfuryl methacrylate | 10 | 10 | 10 | 10 |
| | Component (D) | 2,2-dimethoxy-1,1-diphenylethan-1-one | 1.3 | 1.3 | 1.3 | 1.3 |
| | Compatibilizing agent | Pentaerythritol polyoxyethylene ether | 10 | 10 | 10 | 10 |
| | Polymerization inhibitor | N-(ammoniumoxy)-N-nitrosophenylamine | 0.2 | 0.2 | 0.2 | 0.2 |
| Component (A) | Printing surface layer | (A1) Polymerization degree | — | — | — | — |
| | | (A1) Presence of crosslinkable group | Exist | Exist | Not exist | Not exist |
| | | (A1-1) Polymerization degree | 500 | 1000 | 500 | 1000 |
| | | (A1):(A1-1) (mass ratio) | 0:100 | 0:100 | 0:100 | 0:100 |
| | Underlayer | (A2) Polymerization degree | 500 | 500 | 500 | 500 |
| | | (A2) Presence of crosslinkable group | Exist | Exist | Not exist | Not exist |
| | | Other (A) Polymerization degree | — | — | — | — |
| | | (A2):Other (A) (mass ratio) | 100:0 | 100:0 | 100:0 | 100:0 |
| | Image reproducibility | Minimum half tone dot reproducibility (%) | 1 | 1 | 1 | 1 |
| | | Presence of engraving residue after rinsing | None | None | None | None |
| | Evaluation of crack occurrence in relief | 3,000 | Fail | Pass | Fail | Pass |
| | | 5,000 | Fail | Fail | Fail | Fail |
| | | 8,000 | Fail | Fail | Fail | Fail |
| | | 11,000 | Fail | Fail | Fail | Fail |
| | | 15,000 | Fail | Fail | Fail | Fail |
| | Evaluation of adhesion between printing surface layer and underlayer of laser engraved plate | | Pass | Pass | Pass | Pass |
| | Type D durometer hardness (°) | | 55 | 55 | 55 | 55 |
| | Comprehensive judgment | | Fail | Fail | Fail | Fail |

The invention claimed is:

1. A photosensitive resin printing plate precursor comprising at least a substrate and a photosensitive resin layer, the photosensitive resin layer containing:
   (A) a partially saponified polyvinyl acetate,
   (B) a polyamide having basic nitrogen,
   (C) a compound having an ethylenic double bond, and
   (D) a photopolymerization initiator;
   the photosensitive resin layer including at least an underlayer and a printing surface layer;
   the substrate, the underlayer, and the printing surface layer being included in this order; and
   the photosensitive resin layer containing, as the partially saponified polyvinyl acetate (A), a compound (A1) having an average polymerization degree of 1,200 to 2,600 and a polymer (A1-1) having an average polymerization degree of 400 to 1,000 in the printing surface layer, and a compound (A2) having an average polymerization degree of 400 to 800 in the underlayer.

2. The photosensitive resin printing plate precursor according to claim 1, wherein the compound (C) having an ethylenic double bond has a 5- to 7-membered ring, and the 5- to 7-membered ring is a heterocyclic ring.

3. The photosensitive resin printing plate precursor according to claim 1, wherein the compound (C) having an ethylenic double bond has a 5- to 7-membered ring and has a number average molecular weight of 300 or less, and also has one or more functional groups selected from a hydroxyl group, a carboxyl group, and an amino group.

4. A method of manufacturing a printing plate from the photosensitive resin printing plate precursor according to claim 1, the method comprising cross-linking the photosensitive resin printing plate precursor to obtain a cross-linked printing plate precursor; and applying patterned laser radiation to the cross-linked plate precursor to engrave a resin layer to thus obtain a relief.

5. The method according to claim 4, further comprising rinsing the relief with water or a liquid containing water.

6. A method of manufacturing a printing plate from the photosensitive resin printing plate precursor according to claim 2, the method comprising cross-linking the photosensitive resin printing plate precursor to obtain a cross-linked printing plate precursor; and applying patterned laser radiation to the cross-linked plate precursor to engrave a resin layer to thus obtain a relief.

7. A method of manufacturing a printing plate from the photosensitive resin printing plate precursor according to claim 3, the method comprising cross-linking the photosensitive resin printing plate precursor to obtain a cross-linked printing plate precursor; and applying patterned laser radiation to the cross-linked plate precursor to engrave a resin layer to thus obtain a relief.

8. The method according to claim 6, further comprising rinsing the relief with water or a liquid containing water.

9. The method according to claim 7, further comprising rinsing the relief with water or a liquid containing water.

* * * * *